United States Patent
Mohan et al.

(10) Patent No.: US 7,153,468 B2
(45) Date of Patent: *Dec. 26, 2006

(54) PHYSICAL VAPOR DEPOSITION TARGETS AND METHODS OF FORMATION

(75) Inventors: Vasanth Mohan, San Jose, CA (US); Jianxing Li, Spokane, WA (US); Timothy A. Scott, Post Falls, ID (US)

(73) Assignee: Honeywell International Inc., Morristown, NJ (US)

( * ) Notice: Subject to any disclaimer, the term of this patent is extended or adjusted under 35 U.S.C. 154(b) by 116 days.

This patent is subject to a terminal disclaimer.

(21) Appl. No.: 10/344,772

(22) PCT Filed: Aug. 16, 2001

(86) PCT No.: PCT/US01/25856

§ 371 (c)(1),
(2), (4) Date: Feb. 18, 2003

(87) PCT Pub. No.: WO02/16666

PCT Pub. Date: Feb. 28, 2002

(65) Prior Publication Data

US 2004/0057090 A1    Mar. 25, 2004

Related U.S. Application Data

(63) Continuation-in-part of application No. 09/774,286, filed on Jan. 30, 2001.

(60) Provisional application No. 60/226,214, filed on Aug. 18, 2000.

(51) Int. Cl.
*B22F 3/12* (2006.01)
*C22C 1/05* (2006.01)

(52) U.S. Cl. .................. 419/10; 419/47; 419/48; 75/228; 428/546

(58) Field of Classification Search .............. 419/10, 419/47, 48; 75/228; 428/546
See application file for complete search history.

(56) References Cited

U.S. PATENT DOCUMENTS

| | | | |
|---|---|---|---|
| 4,205,098 A | 5/1980 | Kobayashi et al. | |
| 4,619,697 A | 10/1986 | Hijikata et al. | |
| 4,663,120 A | 5/1987 | Parent et al. | |
| 4,752,335 A | 6/1988 | Korb | |
| 4,767,695 A | 8/1988 | Ong et al. | |
| 4,943,362 A | 7/1990 | Schlamp et al. | |
| 5,215,639 A | 6/1993 | Boys | |
| 5,320,729 A | 6/1994 | Narizuka et al. | |
| 5,342,571 A | 8/1994 | Dittmar et al. | |
| 5,409,517 A | 4/1995 | Satou et al. | |
| 5,435,965 A | 7/1995 | Mashima et al. | |
| 5,439,500 A | 8/1995 | Marx | |
| 5,447,801 A | 9/1995 | Masuda et al. | |
| 5,480,531 A | 1/1996 | Weigert et al. | |
| 5,733,427 A * | 3/1998 | Satou et al. | 204/298.13 |
| 5,736,657 A * | 4/1998 | Ide et al. | 75/230 |
| 5,761,115 A | 6/1998 | Kozicki et al. | |
| 5,762,768 A | 6/1998 | Goy et al. | |
| 5,807,443 A | 9/1998 | Masuda et al. | |
| 5,896,312 A | 4/1999 | Kozicki et al. | |
| 5,906,717 A | 5/1999 | Hasegawa et al. | |
| 5,985,691 A | 11/1999 | Basol et al. | |
| 6,165,413 A * | 12/2000 | Lo et al. | 419/49 |
| 6,214,177 B1 * | 4/2001 | Runkle | 204/192.15 |
| 6,248,291 B1 * | 6/2001 | Nakagama et al. | 419/46 |
| 6,562,207 B1 * | 5/2003 | Ivanov | 204/298.13 |

FOREIGN PATENT DOCUMENTS

| | | |
|---|---|---|
| EP | 0308201 | 3/1989 |
| EP | 0387898 | 9/1990 |
| JP | 59223245 A | 8/1988 |
| JP | 4061124 A | 2/1992 |
| JP | 5-132772 A | 5/1993 |
| JP | 8306485 | 11/1996 |
| JP | 10060636 A | 3/1998 |

* cited by examiner

*Primary Examiner*—Ngoclan T. Mai
(74) *Attorney, Agent, or Firm*—Wells St. John P.S.

(57) ABSTRACT

A method includes combining a solid first material and a solid second material and melting at least a portion of the first material sufficient to coat the second material and any remaining first material. An approximately homogenous distribution of the second material can be formed throughout the liquid phase of the first material. The first material liquid phase can then be solidified to define a composite target blank exhibiting an approximately homogenous distribution of the solid second material in a matrix of the solidified first material. The first material can comprise SE and the second material can comprise Ge and/or Ag. The composite target blank can include at least about 50 vol % matrix. The first and second materials can be powdered metals. Accordingly, a physical vapor deposition target can include a matrix of a first material and an approximately homogenous distribution of particles of a second material throughout the first material matrix. The second material can include powders exhibiting particles sizes no greater than about 325 mesh.

71 Claims, 2 Drawing Sheets

US 7,153,468 B2

PHYSICAL VAPOR DEPOSITION TARGETS AND METHODS OF FORMATION

RELATED PATENT DATA

This application claims priority to PCT Application Ser. No. PCT/US01/25856, filed Aug. 16, 2001 as a continuation-in-part, that claims priority to U.S. patent application Ser. No. 09/774,286, filed Jan. 30, 2001, that claims priority to U.S. Provisional Application Ser. No. 60/226,214, filed Aug. 18, 2000.

TECHNICAL FIELD

This invention relates to methods of forming physical vapor deposition targets and sputter deposition targets, to targets produced by such methods, to films produced by such targets, and, additionally, to targets independent of their method of formation.

BACKGROUND OF THE INVENTION

Germanium selenide is a member of the chalcogenide class of compounds. Films of these compounds have been used in the manufacture of computer memory devices. Memory densities in excess of 340 Mbits/cm$^2$ have been demonstrated with germanium selenide films with a minimum single layer feature size of approximately 0.18 micrometers.

Chalcogenides are finding utility in the manufacture of programmable metallization cells which have the potential for playing a significant role in future generations of computer memories. Thus, efficient formation of germanium selenide films with known and reproducable stoichiometries is an important goal. Germanium selenide films are typically formed by co-sputtering pure germanium and pure selenium targets. Simultaneous sputtering of both targets is carried out with simultaneous deposit of Ge and Se onto a common substrate, thereby creating a film containing both germanium and selenium However, the co-sputtering formation of germanium selenide films requires complex sputtering equipment, increasing processing costs. Also, precise control of two separate sputtering processes to achieve adequate film homogeneity, film uniformity, and film stoichiometry. Achieving such objectives in a production environment, as opposed to a laboratory environment, presents a significant and costly challenge.

SUMMARY OF THE INVENTION

According to one aspect of the invention, a method includes combining a solid first material and a solid second material and melting at least a portion of the first material sufficient to coat the second material and any remaining first material. The melted portion can define a first material liquid phase. An approximately homogenous distribution of the second material can be formed throughout the first material liquid phase. The first material liquid phase can be solidified to define a composite target blank that includes an approximately homogenous distribution of the second solid material in a matrix of the solidified first material. As an example, the first and second materials can include metals. The first material can comprise Se and the second material can comprise at least one of Ag or Ge. The melting of at least a portion of the first material and the forming of an approximately homogenous distribution can occur together and be accomplished by hot pressing. The composite target blank can include at least about 50 volume % (vol %) matrix. The melting can occur in a vessel while heating and compressing the first material. In such case, the first material liquid phase can exhibit a sufficiently high viscosity to prevent a substantial amount of the first material liquid phase from escaping the vessel during compression. Similarly, the viscosity of the first material liquid phase can prevent a substantial amount of second material from settling out of the approximately homogenous distribution in the first material liquid phase. By such methods, a composite target blank can be obtained that exhibits a bulk density of at least about 95% of theoretical density.

According to a further aspect of the invention, a physical vapor deposition target forming method can include combining a first powder comprising a first metal with a second powder comprising a second metal. The first metal can exhibit a melting point at least about 100 Celsius (° C.) less than a melting point exhibited by the second metal. Heat and pressure can be applied to a first volume including the combined first and second powders, changing the first volume to a second volume. The second volume can include at least about 50 vol % liquid phase of the first metal. The second volume may be cooled into a composite target blank having an approximately homogenous distribution of at least the second powder. The first and second powders can exhibit particle sizes no greater than about 325 mesh. Also, the method can further include screening the first and second powders with a 100 mesh screen to separate agglomerations. The applying heat and pressure can include heating to a temperature of less than about the melting point of the second metal at a rate of from about 200 to about 400° C. per hour while under compression of from about 6.9×10$^6$ to about 28×10$^6$ Pascals (about 1,000 to about 4,000 pounds/inch$^2$). Also, the cooling of the second volume can include removing heat to obtain about an intermediate temperature, maintaining about the intermediate temperature for from about 45 to about 90 minutes, and cooling further to a room temperature of from about 20 to about 25° C. The intermediate temperature can be about 200° C. Also, the applying heat can attain a temperature of about 225° C. The first powder can include at least about 99.99 weight percent (wt %) Se on a metals basis and the second powder can include at least about 99.99 wt % Ag or Ge on a metals basis. The composite target blank can further exhibit a bulk density of at least about 98% of theoretical density.

In another aspect of the invention, a composite material can include a matrix of a first material and an approximately homogenous distribution of particles of a second material throughout the first material matrix. Also, a physical vapor deposition target can include at least about 50 vol % matrix and an approximately homogenous distribution of a powder throughout the matrix. The matrix can include a first metal and the powder can include a second metal. Still further, a sputter deposition target can include a continuous matrix of Se encapsulating an approximately homogenous distribution of a powder throughout the Se matrix. The powder can comprise at least about 99.99 wt % Ag or Ge on a metals basis. The target can comprise from about 25 to about 50 wt % of the at least one of Ag or Ge in the Se matrix.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
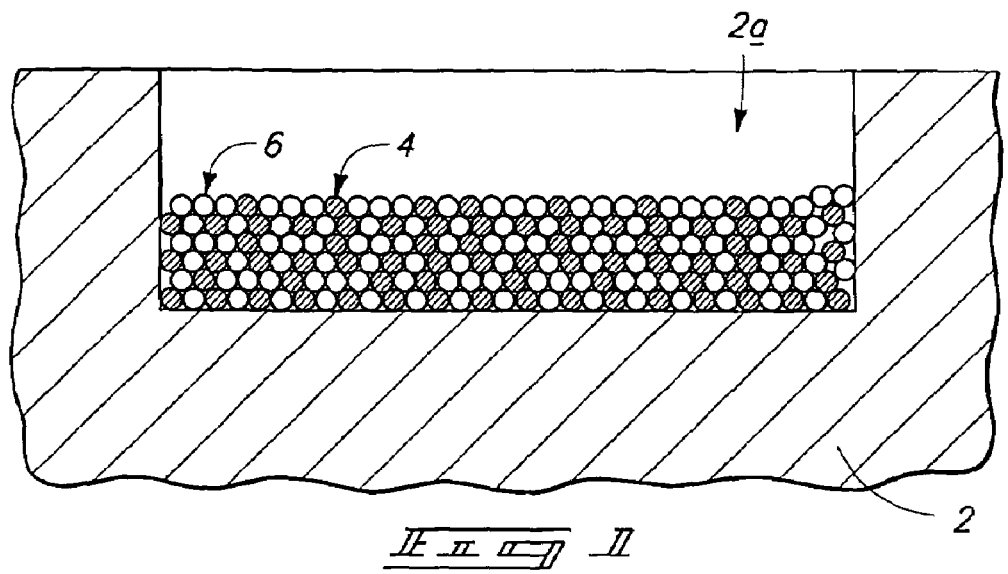
FIG. 1 is a sectional view of a manufacturing device containing materials for formation of a deposition target.

The various aspects of the present invention are potentially applicable to a variety of types of deposition targets and materials for such targets. For example, the aspects of the invention are applicable to physical vapor deposition (PVD) targets, including but not limited to, sputter deposition targets. The specific examples provided herein demonstrating application of the aspects of the invention describe deposition targets including Ge (and/or Ag) and Se, however, it is conceivable that the methods of the present invention may be used to form deposition targets of other metals, as well as non-metals, to the extent that such other materials are suitable for use in deposition targets. Further, the inventions are not limited to PVD targets and the methods herein may be used to form composite materials suitable for other uses. In particular, composite Ge (and/or Ag) and Se materials may be formed.

In one aspect of the invention, a method includes combining a solid first material and a solid second material. The first and second materials can comprise metals. For example, the first material can comprise Se and the second material can comprise at least one of Ag or Ge. The method can further comprise combining at least one additional solid material with the solid first and second materials. Such combining may be accomplished wherein at least one of the first material and the second material comprise a plurality of chemical elements, for example, metallic elements. Alternatively, the first and second material can be, respectively, solid particles of the first and second materials and solid particles of a third material can be added thereto. Nevertheless, most preferably the first material comprises at least about 99.99 weight percent (wt %) Se on a metals basis. Similarly, the second material can comprise at least about 99.99 wt % Ag or Ge on a metals basis.

In addition to the composition of first and second materials, the physical appearance of such materials may be another consideration. For example, one of the typical goals in forming various types of deposition targets is to produce a uniform or homogenous target material. In the case of a single component target, for example a target comprising a high purity single metal, homogeneity is less of a concern. In a multiple component deposition target, such as a $GeSe_2$ or $Ge_3Se_7$ target, homogeneity can be difficult to obtain. A mixture of solid phases of varying compositions within a target having an overall or nominal composition typically detracts from the quality of a sputtered film. For example, in a conventional $GeSe_2$ target, some portions of the target will have a composition of $GeSe_2$ while other portions may have a composition of GeSe, $Ge_3Se_7$, etc. Using such a mixed phase target in a deposition process often may not produce a film having the desired $GeSe_2$ composition even though the nominal composition of the target is $GeSe_2$.

Forming a single phase $GeSe_2$ target can be accomplished by forming a liquid phase of $GeSe_2$ by methods known to those skilled in the art and quenching the liquid phase. Unfortunately, quenching typically produces a shattered single phase $GeSe_2$ target. Such a target is not suitable for a deposition process. Accordingly, the single phase target is ground into fragments and hot pressed into a target shape. The hot pressing accomplishes solid phase bonding among the fragments of single phase $GeSe_2$. Little or no melting during the hot pressing occurs since $GeSe_2$ exhibits a melting point of about 710 Celsius (° C.). In addition, the processes known to those skilled in the art for forming a liquid phase exhibiting a single phase of $GeSe_2$ are complex and cost prohibitive for most applications in which deposition of $GeSe_2$ is desired.

During development of the present invention, it was discovered that the first and second material discussed above are preferably in the form of solid particles. Such particles can be in a variety of shapes and sizes and still achieve at least part of the various aspects of the invention described herein. For example, the first and second materials can exhibit particles sizes no greater than about 100 mesh as measured by methods known to those skilled in the art. More preferably, the first and second materials are in powder form having similar sized particles among the first material and the second material. The powders can be conducive to mixing into a combined first and second material having an approximately homogenous distribution of both materials throughout the volume containing the first and second materials. Most preferably, such powders exhibit particle sizes no greater than about 325 mesh as measured by methods known to those skilled in the art. Experience has indicated that the particle size range of no greater than about 325 mesh provides a sufficiently distributed concentration of Ge (and/or Ag) and Se to form films having a composition adequately near the nominal composition of the target. However, it is conceivable that other size ranges higher or lower may be desired depending on sputter conditions and target blank composition for Ge/Se and Ag/Se composite targets as well as other composite targets. A sufficient distribution of particles preferable keeps compositional variations throughout a target within about +/−5% of the nominal composition for a sample size of at least about 0.25 cm³. For example, in a $GeSe_2$ target blank, the atomic ratio of Ge to Se is preferably between from about 1:1.9 to about 1:2.1 at any point in the target.

During development of the invention, it was also discovered that particles can have a tendency to agglomerate, especially when exposed to moisture. Agglomeration of particles prior to mixing first and second materials can produce portions of a mixture having a disproportionate concentration of at least one of the first and second materials. For example, Ge was shown to exhibit a higher tendency toward agglomeration in comparison to Se. One example of a suitable technique for controlling agglomeration is minimizing moisture exposure. Also, a deposition target forming method can further include screening at least one of the first and second materials to separate agglomerations. As an example, a 100 mesh screen can be used. In this manner, any agglomerations of particles in the combined first and second materials will exhibit a size no greater than about 100 mesh. The screening process may also function to break up agglomerations into much smaller agglomerations or individual particles.

The present aspect of the invention can next include melting at least a portion of the first material sufficient to coat the second material and any remaining first material.

The melted portion can define a first material liquid phase. The method can further include forming an approximately homogenous distribution of the second material throughout the first material liquid phase. Preferably, the melting at least a portion of the first material and the forming an approximately homogenous distribution can occur together and comprise hot pressing. In a typical hot press process, solid phase bonding aided by the formation of a partial melt is desired and temperatures high enough to produce substantial amounts of liquid phase are usually avoided. Because hot pressing involves compression in a die, production of a liquid phase risks expelling at least some of the liquid from the die during compression.

In the case where Se and Ge are used as first and second materials, liquid phase Se at a temperature near its melting point typically exhibits a sufficiently high viscosity that compression during hot pressing does not expel liquid phase Se from a die. Accordingly, the inventors have discovered that temperature controls during hot pressing potentially allow for melting of at least a portion of the first material sufficient to coat the second material without expelling the first material liquid phase from a hot press process.

Since heat and pressure can be applied in other manufacturing vessels aside from a hot press, the same principles would apply to prevent liquid phase from escaping other such vessels even though a conventional hot press device is not used. Pressure also plays a role in preventing first material liquid phase from escaping a vessel since higher applied pressures may produce a desire for higher viscosity. Temperature and pressure are thus interrelated in preventing liquid phase expulsion and can be optimized according to the principles described herein to obtain the goals of the various aspects of the invention.

Producing a first material liquid phase from at least a portion of the first material can be performed in a variety of manners. The melting at least a portion of the first material can include melting substantially all of the first material and substantially none of the second material. Notably, Se exhibits a melting point of about 220° C. while Ge exhibits a melting point of about 938° C. Such a large difference in melting point indicates that substantially all of Se as a first material can be melted while melting substantially none of Ge as a second material. Other materials can also be selected having a suitable temperature difference. For example, the first material can exhibit a melting point at least about 100° C. less than a melting point exhibited by the second material. Accordingly, a first material liquid phase can comprise substantially all of the first material. Also, the liquid phase can be formed such that it does not substantially comprise the second material.

The phase change characteristics of the first and second material can vary depending on the composition of such materials, as well as other factors. Impurities in a single component material, such as Se, can cause the melting point to increase or decrease relative to the melting point of a pure component. Accordingly, depending on the impurity levels, portions of a material might not change phase from solid to liquid at an expected temperature. All that can be expected is for substantially all of the material to melt when temperature is controlled at near the melting point of the primary component. Higher temperatures might be suitable for melting all of the first material. In the context of deposition targets, highly pure materials are typically used so the amount of material not melted at the melting point is often correspondingly small.

In the case of a multiple component material such as the first material or second material, a variety of solid phases can exist in the material. Often, a eutectic phase present in the multiple component material can melt at a significantly lower temperature compared to other phases of the material. A material may thus begin to melt at one temperature but not reach substantially complete melting until a significantly higher temperature. Again, the presence of impurities can result in small amounts of material not changing phase to a liquid when seemingly all of the material has melted. In a related sense, a second material may comprise a small amount of a eutectic phase that melts during the melting of the first materiel even though the second material melting is largely unnoticed due to the small amount. As an example, such eutectic phase can even be formed due to the presence of impurities in an otherwise highly pure material. Accordingly, all that can be expected is that the first material liquid phase can be formed such that it does not substantially comprise the second material.

Of course, an interface can exist between the first material liquid phase and the solid second material. At the interface, atomic interactions may occur to form eutectic compositions or other compositions including elements from both the liquid and solid. For example, GeSe, $GeSe_2$, etc. can form at the interface. However, the first material liquid phase does not substantially comprise the second material as a result of small amounts of such compositions forming at interfaces. The two phases remain largely separate.

Another advantage of the viscous nature of liquid Se, and perhaps other materials, is that particles remaining solid during the melting of at least a portion of the first material will not tend to settle out of the distribution in the original combination of solid first and second materials. If solid first and second materials are approximately homogenously distributed, then a sufficiently high viscosity can prevent a substantial number of particles from settling out of the approximately homogenous distribution. A method according to an aspect of the invention can include forming an approximately homogenous distribution of the second material throughout the first material liquid phase simply by providing a homogenous distribution of solid first and second materials when originally combined. The particle sizes discussed above and reduction of agglomeration assist in producing a homogenous distribution in the combined materials. The first and second material can be blended in any suitable device known to those skilled in the art to produce an approximately homogenous distribution. Additionally, additives may be included in the combination of first and second materials that are known to those skilled in the art to assist in efficient and/or effective mixing.

Figure 2:
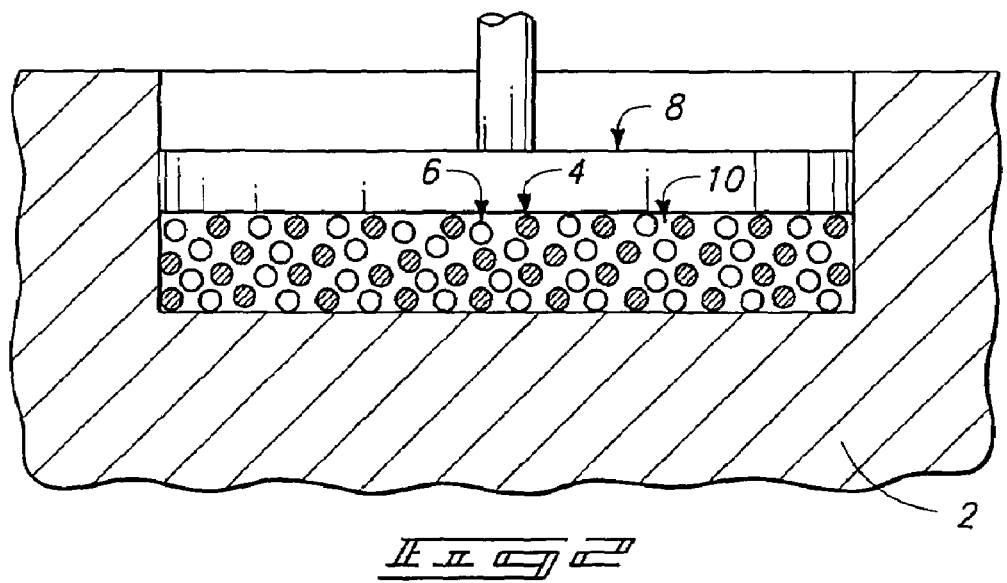
FIG. 2 is a sectional view of the device in FIG. 1 at a processing step subsequent to that depicted by FIG. 1.
Figure 3:
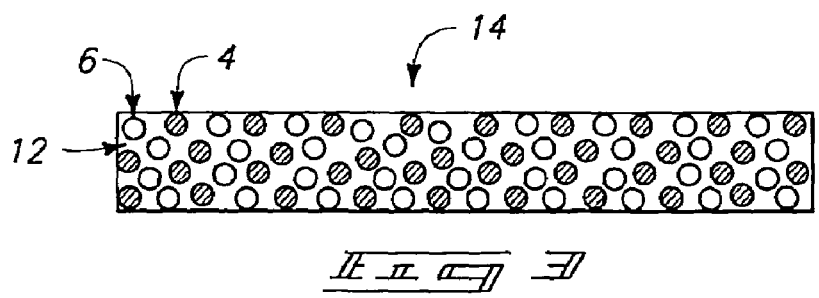
FIG. 3 is a sectional view of the material of FIG. 2 at a processing step subsequent to that depicted by FIG. 2.

Turning to FIG. 1, a bottom die 2 of a hot press apparatus is shown with first material particles 6 and second material particles 4 placed in a cavity 2a of bottom die 2. FIG. 2 shows punch 8 positioned inside cavity 2a and applying pressure to first material particles 6 and second material particles 4 while such particles are heated. The heating of the materials is sufficient to form a liquid phase 10 from a portion of first material particles 6. Notably, particles 4,6 are shown generically without any regard to particle size or shape and are for explanation purposes only. In FIG. 1, approximately twice the number of first material particles 6 are shown in comparison to second material particles 4. In FIG. 2, approximately 50 volume % (vol %) of first material particles 6 are melted to form liquid phase 10. Particles 4,6 of FIG. 1 form a first volume while particles 4,6 and liquid phase 10 of FIG. 2 form a second volume smaller than the first volume. FIG. 3 shows target blank 14 after solidification of liquid phase 10 into matrix 12. FIG. 3 also shows target blank 14 having a third volume less than the first volume of FIG. 1, but may be the same or different than the second volume.

As can be seen in the Figures, about 33 vol % of the first volume was melted to coat second material particles 4 and remaining first material particles 6. Although about 33 vol % are shown melted in FIG. 2, the amount melted is by way of example only and not as a limitation that 33 vol % is sufficient or necessary to coat second material particles 4 and remaining first material particles 6. Surface properties of liquid phase 10 and particles 4, 6 constitute a major factor in determining the volume of liquid phase 10 sufficient to coat particles 4, 6.

Preferably, the second volume of FIG. 2 comprises at least about 50 vol % liquid phase of at least one of first material particles 6 and second material particles 4. That is, although shown that only first material particles 6 are melted, it is conceivable that some amount of a second material could also be comprised by the liquid phase. More preferably, the second volume comprises at least about 50 vol % liquid phase of the first material. In the case of $GeSe_2$ or $Ge_3Se_7$, the amount of Se present is sufficient to form at least about 50 vol % liquid phase without melting any Ge. Ge exhibits a density of about 5.3 grams/centimeter$^3$ (g/cm$^3$) and Se exhibits a density of about 4.8 g/cm$^3$ at standard state conditions. Ge and Se also have similar atomic weights. Such data is available for other component systems that could be included in deposition targets. The data can be used to determine whether a nominal composition of a target is adequate to produce enough liquid phase upon melting a first material. It may be desirable to melt at least some of the second material if the liquid phase is otherwise not sufficient to coat the second material.

The density of $GeSe_2$ at standard state conditions is 4.56 g/cm$^3$ and it is desirable for the bulk density of a deposition target to exhibit a density near the theoretical pure component density. Approximating theoretical density can also be desirable in deposition targets formed of other materials. The method according to the present aspect of the invention can obtain a deposition target bulk density of at least about 95% of theoretical density. Preferably, the method produces at least about 97% of theoretical density, or more preferably, at least about 98% of theoretical density. The high percent of theoretical density possible with the present method is difficult to obtain simply by conventional hot pressing of a solid first material combined with a solid second material. It is even difficult to obtain by hot pressing ground-up single phase $GeSe_2$. The specific mechanism by which the present invention achieves a high percent of theoretical density is not well understood. It is believed that densification of combined first and second materials involves a combination of mechanisms that may include particle rearrangement, solid state diffusion, and the formation of the liquid phase, as such mechanisms are known to those skilled in the art. Inadequate heating at too low a temperature and/or for too short a time and/or inadequate compression can produce inadequate densification.

In the present aspect of the invention, applying heat and pressure can include heating to a temperature of less than about the melting point of the second material under compression of from about $6.9 \times 10^6$ to about $28 \times 10^6$ Pascals (about 1,000 to about 4,000 pounds/inch$^2$ (psi)). Preferably, the heating can be conducted at a rate of from about 200 to about 400° C. per hour. As an example, the heating can attain a temperature of about 225° C. Such temperature has proven sufficient to melt substantially all of the Se in a combination of Ge and Se powders under compression.

After forming a suitable liquid phase, the present method can include solidifying the first material liquid phase to define a composite target blank that includes an approximately homogenous distribution of the solid second material in a matrix of the solidified first material. Alternatively, the liquid phase can comprise at least one of the first material and the second material and cooling the heated material can form a solid matrix from the liquid phase. The cooled material thus defines a composite target blank comprising some of the solid particles in the solid matrix. Cooling can include removing heat to attain about an intermediate temperature, maintaining about the intermediate temperature for from about 45 to about 90 minutes, and cooling further to a room temperature of from about 20 to about 25° C.

Most preferably, the hot pressing attains a temperature of greater than about 200° C. and the cooling includes maintaining a pressure applied during the hot pressing while removing the heat to attain about 200° C. Temperature can be maintained at about 200° C. for from about 15 to about 60 minutes followed by further cooling to room temperature and removing the pressure when room temperature is attained. In the method described above, a highly densified composite deposition target can be produced having a composition determined largely by the precision and accuracy with which solid materials are quantitatively blended. Further processing of blended components can produce a homogenous distribution of selected solid materials in a matrix of solidified other selected materials. The homogeneity and density contribute to the high quality of the deposition target.

In a further aspect of the invention, a PVD target can include a matrix of a first material and an approximately homogenous distribution of particles of a second material throughout the first material matrix. The first material matrix can comprise a first metal, and the particles of the second material can comprise a powder of a second metal. The target can include at least about 50 vol % matrix. The matrix can comprise at least about 99.99 wt % Se on a metals basis and the second material can comprise at least about 99.99 wt % Ag or Ge on a metals basis. For example, Se and Ge (and/or Ag) can be provided at a purity level of about 99.999 wt %.

The matrix can comprise substantially all of the first material and may be a continuous matrix encapsulating the second material. Preferably, the matrix does not substantially comprise the second material. The particles of the second material can exhibit particle sizes no greater than about 100 mesh, or preferably no greater than about 325 mesh. Further, any second material particle agglomerations can exhibit a size no greater than about 100 mesh. A target comprising from about 25 to about 50 wt % of at least one of Ag or Ge in an Se matrix may be particularly useful and valuable. For example, the target may exhibit a stoichiometric atomic ratio of Ge to Se of about 1:2 or about 3:7. Even so, the ratio of Ge to Se can correspond to another known germanium selenide or to a non-stoichiometric composition. Advantageously, the films deposited from the above described targets can exhibit substantial homogeneity of the same ratio of components contained in the targets.

Figure 4:
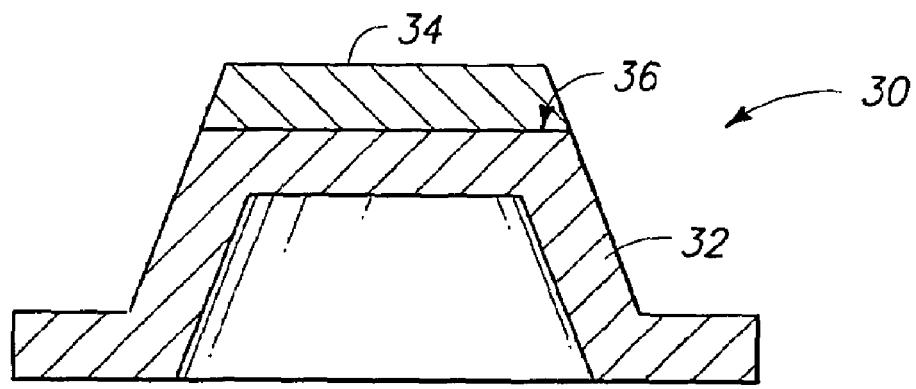
FIG. 4 shows a sectional view of a target/backing plate construction with target formed in accordance with methodology of the present invention. The construction corresponds to a large ENDURA™ configuration.
Figure 5:
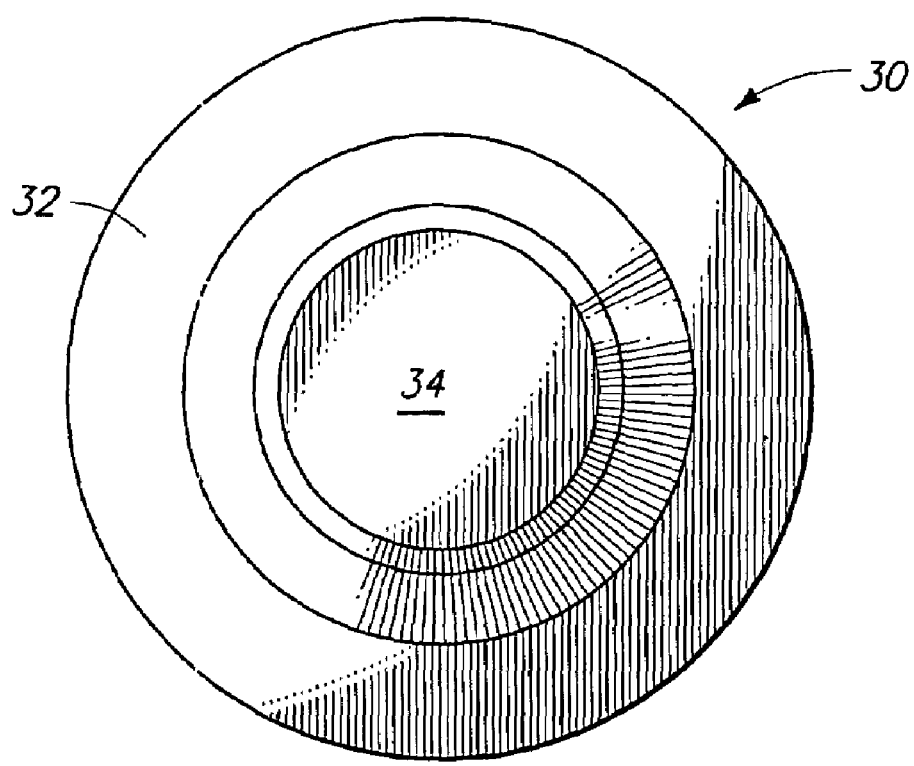
FIG. 5 is a top view of the target/backing plate construction of FIG. 4.

An exemplary backing plate/target assembly encompassed by the present invention is shown in FIGS. 4 and 5 as assembly 30. Assembly 30 comprises a backing plate 32 bonded to a target blank 34. Backing plate 32 and target blank 34 join at an interface 56, which can comprise, for example, a diffusion bond between the backing plate and target or a solder bond. Target blank 34 can comprise, for example, a $GeSe_2$ or $Ge_3Se_7$ composite target blank. Backing plate 32 and target blank 34 can comprise any of numerous configurations, with the shown configuration being exemplary. Backing plate 32 and target 34 can comprise, for example, an ENDURA™ configuration, and accordingly can comprise a round outer periphery. FIG. 5 shows assembly 30 in a top-view, and illustrates the exemplary round outer periphery configuration.

EXAMPLE NO. 1

A powder blend having the nominal composition $GeSe_2$ was prepared and loaded into a hot press die. The die was loaded into a hot press chamber and 2,500 psi was applied to the die assembly. The hot press chamber was evacuated, backfilled with argon gas, and maintained at a pressure of approximately 500 Torr. The temperature was increased from ambient temperature to 225° C. at a rate of approximately 300° C. per hour. 225° C. was maintained for 60 minutes. The temperature was reduced to 200° C. and maintained for 45 minutes. The temperature was reduced to room temperature and then pressure was released. The resulting material exhibited a 97% theoretical density.

EXAMPLE NO. 2

The same procedure as described in Example 1 was carried out except that the temperature of 225° C. was maintained for 68 minutes instead of 60 minutes. A material with a greater than 98% theoretical density was produced.

EXAMPLE NO. 3

The same procedure as described for Example 1 was carried out except for the powder blend had a nominal composition of $Ge_3Se_7$ and the temperature of 225° C. was maintained for 70 minutes instead of 60 minutes and material exceeding 99% theoretical density was produced.

The invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims.

We claim:

1. A method comprising:
    combining solid Se and at least one of solid Ag or solid Ge;
    melting at least a portion of the Se sufficient to coat the Ag or Ge and any remaining Se, the melted portion defining an Se liquid phase;
    forming an approximately homogenous distribution of the Ag or Ge throughout the Se liquid phase;
    solidifying the Se liquid phase to define a composite material comprising an approximately homogenous distribution of the solid Ag or Ge in a matrix of the solidified Se.

2. The method of claim 1 wherein the solid Se and the at least one of solid Ag or solid Ge are metal particles and exhibit particle sizes no greater than about 325 mesh.

3. The method of claim 1 wherein the Se comprises at least about 99.99 weight percent (wt %) Se, the Ag or Ge respectively comprise at least about 99.99 wt % Ag or Ge, and the composite material comprises from about 25 to about 50 wt % of the at least one of Ag or Ge in the Se matrix.

4. The method of claim 1 wherein the composite material comprises at least about 50 volume percent (vol %) matrix.

5. The method of claim 1 wherein the composite material is formed as a physical vapor deposition target blank.

6. The method of claim 1 wherein the at least one of solid Ag or solid Ge consists of solid Ge.

7. A physical vapor deposit on target forming method comprising:
    combining a solid first material containing Se with a solid second material containing Ag and/or Ge;
    melting at least a portion of the first material sufficient to coat the second material and any remaining first material, the melting occuring in a vessel while heating the first material to a temperature and compressing the first material at a pressure, the melted portion defining a first material liquid phase that does not substantially comprise the second material, the first material liquid phase exhibiting a sufficiently high viscosity at the temperature to prevent a substantial amount of second material from settling out of the approximately homogenous distribution in the first material liquid phase and to prevent a substantial amount of the first material liquid phase from escaping the vessel at the pressure;
    forming an approximately homogenous distribution of the second material throughout the first material liquid phase; and
    cooling and solidifying the first material liquid phase to define a composite target blank comprising an approximately homogenous distribution of the solid second material in a matrix of the solidified first naterial.

8. The method of claim 7 wherein the first and second materials comprise metals.

9. The method of claim 7 wherein the solid first and second materials comprise particles and exhibit particle sizes no greater than about 100 mesh.

10. The method of claim 7 wherein the first material comprises Se and the second material comprises Ge.

11. The method of claim 7 wherein the first material comprises Se and the second material comprises Ag.

12. The method of claim 7 further comprising combining at least one additional solid material with the solid first and second materials.

13. The method of claim 7 wherein the melting at least a portion of the first material and the forming an approximately homogenous distribution occur together and comprise hot pressing.

14. The method of claim 7 wherein the melting at least a portion of the first material comprises melting substantially all of the first material and substantially none of the second material.

15. The method of claim 7 wherein the composite target blank comprises at least about 50 vol % matrix.

16. The method of claim 7 wherein the melting occurs at a temperature of less than about a melting point of the second material.

17. The method of claim 7 wherein the heating and compressing comprises heating to a temperature of less than the melting point of the second material at a rate of from 200 to 400° C. per hour while under compression of from $6.9 \times 10^6$ to $28 \times 10^6$ Pascals (1000 to 4000 pounds/inch$^2$).

18. The method of claim 7 wherein the cooling and solidifying the first material liquid phase comprises removing heat to attain an intermediate temperature, maintaining the intermediate temperature for from 45 to 90 minutes, and cooling further to a room temperature of from 20 to 25 C.

19. The method of claim 7 wherein the composite target blank exhibits a bulk density of at least about 95% of theoretical density.

20. A physical vapor deposition target forming method comprising:
   combining solid particles of a first metal with solid particles of a second metal;
   applying heat and pressure to the combined solid particles and forming a heated material comprising at least about 50 vol % liquid phase of at least one of the first metal and the second metal; and
   cooling the heated material to form a solid matrix from the liquid phase, the cooled material defining a composite target blank comprising some of the solid particles in the solid matrix.

21. The method of claim 20 wherein the first metal comprises Se and the second metal comprises Ge.

22. The method of claim 20 wherein the first metal comprises Se and the second metal comprises Ag.

23. The method of claim 20 wherein at least one of the first metal and second metal comprise a plurality of metallic elements.

24. The method of claim 20 further comprising separating agglomerations of the solid particles prior to applying heat and pressure.

25. The method of claim 20 wherein the solid particles of the first and second metals exhibit particle sizes no greater than about 325 mesh.

26. The method of claim 20 wherein the liquid phase does not substantially comprise the second metal and the heated material comprises an approximately homogenous distribution of solid particles of the second metal throughout the liquid phase.

27. The method of claim 20 wherein the liquid phase comprises substantially all of the first metal.

28. The method of claim 20 wherein the applying heat and pressure comprises heating to a temperature of less than about a melting point of the second metal under compression of from about $6.9 \times 10^6$ to about $28 \times 10^6$ Pascals (about 1000 to about 4000 pounds/inch$^2$).

29. The method of claim 20 wherein the applying heat and pressure occur together in a vessel, the liquid phase exhibiting a sufficiently high viscosity during the applying to prevent a substantial amount of the liquid phase from escaping the vessel.

30. The method of claim 20 wherein the particles remaining solid during the applying heat and pressure form an approximately homogenous distribution throughout the liquid phase, the liquid phase exhibiting a viscosity sufficiently high to prevent a substantial number of particles from settling out of the approximately homogenous distribution.

31. A physical vapor deposition target forming method comprising:
   combining a first powder comprising a first metal with a second powder comprising a second metal, the combined first and second powders having a first volume and the first metal exhibiting a melting point at least about 100° C. less than a melting point exhibited by the second metal;
   applying heat and pressure to the first volume and changing the first volume to a second volume, the second volume comprising at least about 50 vol % liquid phase of the first metal; and
   cooling the second volume into a composite target blank comprising an approximately homogenous distribution of at least the second powder throughout a solid matrix comprising the first metal.

32. The method of claim 31 wherein the first metal comprises Se and the second metal comprises Ge.

33. The method of claim 31 wherein the first metal comprises Se and the second metal comprises Ag.

34. The method of claim 31 wherein the first and second powders exhibit particle sizes no greater than about 325 mesh, the method further comprising screening at least one of the first and second powders with a 100 mesh screen to separate agglomerations.

35. The method of claim 31 wherein the applying heat and pressure comprises heating to a temperature of less than about the melting point of the second metal at a rate of from about 200 to about 400° C. per hour while under compression of from about $6.9 \times 10^6$ to about $28 \times 10^6$ Pascals (about 1000 to about 4000 pounds/inch$^2$).

36. The method of claim 31 wherein the cooling the second volume comprises removing heat to attain about an intermediate temperature, maintaining about the intermediate temperature for from about 45 to about 90 minutes, and cooling further to a room temperature of from about 20 to about 25° C.

37. The method of claim 31 wherein the composite target blank exhibits a bulk density of at least about 97% of theoretical density.

38. A physical vapor deposition target produced by the method of claim 7.

39. A physical vapor deposition target produced by the method of claim 21.

40. A film produced by the physical vapor deposition target of claim 38.

41. A film produced by the physical vapor deposition target of claim 39.

42. A composite material comprising a Se matrix as a continuous solid phase separate from an approximately homogenous distribution at at least one of solid Ag or solid Ge throughout the Se matrix.

43. The material of claim 42 wherein the at least one of solid Ag or solid Ge comprises metal particles and exhibits particle sizes no greater than about 325 mesh.

44. The material of claim 42 wherein the Se comprises at least about 99.99 wt % Se, the Ag or Ge respectively comprise at reast about 99.99 wt % Ag or Ge, and the composite material comprises torn about 25 to about 50 wt % of the at least one of Ag or Ge in the Se matrix.

45. The material of claim 44 wherein the composite material comprises at least about 50 vol % matrix.

46. The material of claim 45 wherein the composite material is a physical vapor deposition target blank.

47. A physical vapor deposition target comprising a matrix of a first material solidified from a liquid as a continuous phase separate from and encapsulating an approximately homogenous distribution of particles of a second material throughout the first material matrix, the first material exhibiting a melting point at least about 100° C. less than a melting point exhibited by the second material and the liquid not substantially comprising any chemical element of the second material.

48. The target of claim 47 wherein the first and second materials comprise metals.

49. The target of claim 47 wherein the second material particles exhibit particle sizes no greater than about 100 mesh.

50. The target of claim 47 wherein any second material particle agglomerations are no greater than about 100 mesh.

51. The target of claim 47 wherein the first material comprises Ge and the second material comprises Ge.

52. The target of claim 47 wherein the first material comprises Se and the second material comprises Ag.

53. The target of claim 47 further comprising a third material.

54. The target of claim 47 wherein the target comprises at least about 50 vol % matrix.

55. The target of claim 47 wherein the first and second materials consist of different first and second metals, respectively.

56. The target of claim 47 wherein the target exhibits a bulk density of at least about 95% of theoretical density.

57. The target of claim 47 wherein the matrix does not substantially comprise any chemical element of the second material.

58. A physical vapor deposition target comprising at least about 50 vol % matrix solidified from a liquid as a continuous phase separate from and encapsulating an approximately homogenous distribution of a powder throughout the matrix, the matrix containing substantially all of a first metal and the powder containing a second metal, the matrix not substantially containing any metallic element of the second metal.

59. The target of claim 58 wherein the powder exhibits particle sizes no greater than about 325 mesh.

60. The target of claim 58 wherein the first metal comprises Se and the second metal comprises Ge.

61. The target of claim 58 wherein the first metal comprises Se and the second metal comprises Ag.

62. The target of claim 58 wherein at least one of the first metal and second metal comprise a plurality of metallic elements.

63. The target of claim 58 wherein the target exhibits a bulk density of at least about 97% of theoretical density.

64. A physical vapor deposition target comprising a continuous matrix of Se encapsulating an approximately homogenous distribution of a powder throughout the Se matrix, the powder comprising at least about 99.99 wt % of at least one of Ag or Ge on a metals basis and the target exhibiting a Se matrix with a combined Ag and Ge content from about 25 to about 50 wt %.

65. The target of claim 64 wherein the tarqet comprises at least about 50 vol % matrix.

66. The target of claim 65 wherein the matrix comprises substantially all of the Se and does not substantially comprise the Ag or Ge.

67. The target of claim 64 wherein the target exhibits a bulk density of at least about 98% of theoretical density.

68. The target of claim 64 wherein the powder comprises about 99.99 wt % Ge.

69. A physical vapor deposit on target comprising a matrix of a first material comprising Se and an approximately homogenous distribution of particles of a second material comprising Ge or Ag throughout the first material matrix.

70. A physical vapor deposit on target comprising at least about 50 vol % matrix and an approximately homogenous distribution of a powder throughout the matrix, the matrix comprising Se and the powder comprising Ge or Ag.

71. A physical vapor deposit on target comprising a matrix containing Se and an approximately homogenous distribution of a powder throughout the matrix, the powder consisting essentially of Ge or Ag and the target comprising from about 25 to about 50 weight percent Ge or Ag throughout the matrix.

* * * * *